United States Patent [19]

Mehta

[11] Patent Number: 5,635,102
[45] Date of Patent: Jun. 3, 1997

[54] HIGHLY SELECTIVE SILICON OXIDE ETCHING METHOD

[75] Inventor: Jitesh Mehta, West Bloomington, Minn.

[73] Assignee: FSI International, Chaska, Minn.

[21] Appl. No.: 314,206

[22] Filed: Sep. 28, 1994

[51] Int. Cl.$^6$ .............. B44C 1/22; C03C 25/06; C23F 1/12; H01L 21/306
[52] U.S. Cl. .............. 428/428; 252/79.3; 134/2; 134/3; 438/738; 438/743
[58] Field of Search .............. 156/643, 646, 156/650, 651, 652, 653, 657, 662; 134/2, 3; 252/79.1, 79.3

[56] References Cited

U.S. PATENT DOCUMENTS

| | | | |
|---|---|---|---|
| 2,841,477 | 7/1958 | Hall | 41/42 |
| 3,122,463 | 2/1964 | Ligenza et al. | 156/4 |
| 3,669,774 | 6/1972 | Dismukes | 156/17 |
| 4,065,369 | 12/1977 | Ogawa et al. | 204/164 |
| 4,160,690 | 7/1979 | Shibagaki et al. | 156/643 |
| 4,175,235 | 11/1979 | Niwa et al. | 250/547 |
| 4,183,306 | 1/1980 | Niwa | 156/643 |
| 4,183,780 | 1/1980 | McKenna et al. | 156/643 |
| 4,314,875 | 2/1982 | Flamm | 156/643 |
| 4,498,953 | 2/1985 | Cook et al. | 156/646 |
| 4,522,674 | 6/1985 | Ninomiya et al. | 156/345 |
| 4,540,466 | 9/1985 | Nishizawa | 156/643 |
| 4,643,799 | 2/1987 | Tsujii et al. | 156/345 |
| 4,678,536 | 7/1987 | Murayama et al. | 156/635 |
| 4,687,544 | 8/1987 | Bersin | 156/643 |
| 4,741,800 | 5/1988 | Yamazaki | 156/643 |
| 4,749,440 | 6/1988 | Blackwood et al. | 156/646 |
| 4,857,140 | 8/1989 | Loewenstein | 156/643 |
| 4,871,416 | 10/1989 | Fukuda | 156/635 |
| 4,938,815 | 7/1990 | McNeilly | 156/612 |
| 5,022,961 | 6/1991 | Izumi et al. | 156/646 |
| 5,028,560 | 7/1991 | Tsukamoto et al. | 437/81 |
| 5,030,319 | 7/1991 | Nishino et al. | 156/635 |
| 5,068,040 | 11/1991 | Jackson | 210/748 |
| 5,089,084 | 2/1992 | Chhabra et al. | 156/646 |
| 5,178,682 | 1/1993 | Tsukamoto et al. | 118/722 |
| 5,201,994 | 4/1993 | Nonaka et al. | 156/643 |
| 5,221,423 | 6/1993 | Sugino et al. | 156/646 |
| 5,228,206 | 7/1993 | Grant et al. | 34/1 |
| 5,234,540 | 8/1993 | Grant | 156/646 |
| 5,236,602 | 8/1993 | Jackson | 210/748 |
| 5,254,176 | 10/1993 | Ibuka et al. | 134/2 |
| 5,510,299 | 4/1996 | Li et al. | 437/225 |

FOREIGN PATENT DOCUMENTS

| | | |
|---|---|---|
| 063273 | 10/1982 | European Pat. Off. . |
| 57-200569 | 12/1982 | Japan . |
| 1180187 | 2/1970 | United Kingdom . |

OTHER PUBLICATIONS

Werkhoven, et al.; *Cluster–Tool Integrated HF Vapor Etching for Native Oxide Free Processing;* Mat. Res. Soc. Symp. Proc., 315, pp. 211–217 (1993).

Loewenstein, et al.; *Pad Oxide Roughening in a Remote Plasma Etch Process for Silicon Nitride Using an In–Situ Spectral Ellipsometer;* Proc. of ECS, 93,373 (1993).

Saito, et al.; *Plasmaless Cleaning Process of Silicon Surface Using Chlorine Triflouride;* Appl. Phys. Lett.; 56, 1119–1121 (1990).

Moran, et al.; *Initiation Phenomena in Pulsed Chemical Lasers;* Naval Research Laboratory, Oct., 1978.

Miki et al, "Vapor–Liquid Equilibrium of the Binary System $HF-H_2O$ extending to Extremely Anhydrous Hydrogen Fluoride", J. Electrochem. Soc. 137, 787–790 9 (Mar. 1990).

Werkhoven, et al, "Contamination Control of Polysilicon Gates in a Vertical Reactor Cluster Tool," Journal of the IES, May/Jun. 1993, pp. 33–36.

Hendriks, et al, "Poly–gate Structures Manufactured in a Cluster Tool," Applied Surface Science, 70/71. (1993), 619–623.

Wantanabe, et al, "A New Cylindrical Capacitor Using Hemispherical Grained Si (HSG–Si) for 256Mb DRAMs", IEDM Technical Digest, 10.1.1–10.1.4 (Dec. 1992).

Galewski, et al, "Silicon Wafer Preparation for Low–Temperature Selective Epitaxial Growth," IEEE Translations on Semiconductor Manufacturing, 93–98 (Aug. 1990).

(List continued on next page.)

*Primary Examiner*—W. Robinson H. Clark
*Attorney, Agent, or Firm*—Vidas, Arrett & Steinkraus, P.A.

[57] ABSTRACT

A process for selectively removing a porous silicon oxide layer from a substrate having a portion thereon with an exposed dense silicon oxide to be retained on the substrate, the porous silicon oxide layer containing absorbed moisture therein, the process comprising:

introducing the substrate to a flowing anhydrous gaseous environment consisting of anhydrous inert gas;

adding anhydrous hydrogen fluoride gas to the gaseous environment for a pulse time which is at most only shortly longer than that required to initiate etching of the dense silicon oxide;

flushing the gaseous environment with anhydrous inert gas for a time sufficient to remove said hydrogen fluoride and water vapor generated by the etching of the porous oxide; and, repeating said adding and flushing steps until said porous oxide layer has been removed.

The process has particular application in manufacturing of capacitors on microelectronic devices for etching out BP TEOS or other such doped porous oxides contained within an open polysilicon structure built on a portion of a blanket layer of dense silicon oxide, such as TEOS. The process permits extremely highly selective removal of porous silicon oxides, especially doped oxides, relative to dense silicon oxides in a gentle manner. In particular, the process provides selectivity for removal of BP TEOS over removal of TEOS of greater than 50:1 based upon oxide layer thickness removed.

22 Claims, 5 Drawing Sheets

OTHER PUBLICATIONS

Martin, et al, "LPVCD $Si_3N_4$ growth retardation on silicon native oxide compared with in situ HF vapour–deglazed silicon substrates", Semicond. Sci. Technol. 6 (1991) 1100–1102.

"The Activity of $HF/H_2O$ Treated Silicon Surfaces in Ambient Air Before and After Gate Oxidation"; Ara Philipossian; J. Electrochem Soc. vol. 139, No. 10, Oct. 1992.

"Selective Etching of Native Oxide by Dry Processing Using Ultra Clean Anhydrous Hydrogen Fluoride"; N. Miki et al. pp. 731–733, 1988.

"Gas–Phase Selective Etching of Native Oxide"; M. Noburhiro et al. IEEE Transaction on Electron Devices, vol. 37, No. 1, Jan. 1990, pp. 107–115.

"Characterization of Wafer Cleaning and Oxide Etching Using Vapor–Phase Hydrogen Fluoride" by M. Wong et al, *J. Electrochem. Soc.*, vol. 138, No. 6, Jun. 1991, pp. 1799–1802.

"Wafer Temperature Dependence of the Vapor–Phase HF Oxide Etch" by Man Wong et al, *J. Electrochem. Soc.*, vol. 140. No. 1, pp. 205–208.

"Vapor Phase Cleaning of Submicron Inter–Metal Vias" by Daniel P. Gay et al, *FSI Technical Report*, TR397, Nov. 5, 1993.

"Plasmaless dry etching of silicon with fluorine–containing compounds", J. Appl. Phys. 56(10), 15 Nov. 1984, pp. 2939–2942.

"CDE Patent Search—Technical Summary, Chemical Down Stream Etch Tools, Process, and Chemistry", Paul K. Aum, Jan. 7, 1994.

"Mechanisms of the $HF/H_2O$ Vapor Phase Etching of $SiO_2$", C.R. Helms and B.E. Deal, Journal of the IES, May/Jun. 1992, pp. 21–26.

"A New Cleaning method by Using Anhydrous $HF/CH_3OH$ Vapor System" by A. Izumi et al, *EOS Proceedings*, vol. 92–12 (1992), pp. 260–267.

"Etching of Thermal Oxides in Low Pressure Anhydrous $HF/CH_3OH$ Gas Mixture at Elevated Temperature", by J. Ruzyllo et al, *J. Electrochem. Soc.*, vol. 140, No. 4, Apr. 1993, pp. L64–L66.

"Selective Etching of Native Oxide by Dry Processing Using Ultra Anhydrous Hydrogen Fluoride" by N. Miki et al, 730 IEDM 88.

"Selective Interhalogen Etching of Tantalum Compounds and Other Semicondutor Materials" by D. E. Ibbotson et al, *Appl. Phys. Lett.* 46(8), 15 Apr. 1985, pp. 794–796.

Abstract: Pat. No. 3,511,727 to Hays, issued May 7, 1912.
Abstract: Pat. No. 5,240,554 to Hayaski Hisataka, issued Aug. 31, 1993.
Abstract: Pat. No. 5,122,225 to Monte issued Jun. 16, 1992.
Abstract: Pat. No. 5,094,978 to Miyagaki Shinji et al. issued Mar. 10, 1992.
Abstract: Pat. No. 4,717,447 to Dieleman issued Jan. 5, 1988.
Abstract: Pat. No. 4,574,177 to Wang issued Mar. 4, 1986.
Abstract: Pat. No. 4,125,672 to Kakushi et al. issued Jan. 14, 1978.
Abstract: Pat. No. 4,440,883 to Pammer Erich issued Apr. 3, 1984.
Abstract: Pat. No. 4,310,380 to Flamm issued Jan. 12, 1982.
Abstract: Pat. No. 5,069,724 to Fujii et al. issued Dec. 3, 1991.
Abstract: Pat. No. 4,799,991 to Dockrey issued Jan. 24, 1989.

"Native oxide removal on Si surface by $NF_3$ added hydrogen plasma downstream treatment", Jun Kikuchi, Masao Iga, Shuzo Fujimura and Hiroshi Yano, SPIE vol. 2091, pp. 154–159.

"Silicon Surface Cleaning Uisng Photoexcited Flourine Gas Diluted with Hydrogen", Takayuki Aoyama, Tatsuya Yamazaki, and Tokashi Ito, J. Electrochem. Soc., vol. 140. No. 6, Jun. 1993, pp. 1704–1708.

"A Dry Etching Technology Using Long–Lived Active Species Excited by Microwave", Y. Horiike and M. Shibagaki, Toshiba Research and Development Center, Tokoyo Shibaura Electric Co, Ltd. Kawasaki, Japan.

"Highly Selective Etching of $Si_3N_4$ to $SiO_2$ Employing Fluorine and Chlorine Atoms Generated by Microwave Discharge", S. Suto, N. Hayasaka, H. Okano, and Y. Horiike, J. Electrochem. Soc. vol. 136, No. 7, Jul. 1989, pp. 2032–2034.

"Directional Dry Etching of Silicon by a Reactive Nozzle–Jet", Hideo Akiya, Proc. of DPS, pp. 119–126, Oct. 1981, Tokyo, Japan.

"Selective etching of silicon nitride using remot plasmas of $CF_4$ and $SF_6$", Lee M. Loewenstein, J. Vac. Scl. Technol. A, vol. 7, No. 3, May/Jun. 1989, pp. 686–1394.

"Selective Isotropic Dry Etching of $Si_3N_4$ over $SiO_2$", F.H.M. Sanders, J. Dieleman, H.J.B. Peters, and J.A.M. Sanders, J. Electrochemical Soc. vol. 129, No. 11, pp. 2559–2561.

"Highly Selective Etching of $Si_3N_4$ Over $SiO_2$ Employing a Downstream Type Reactor", N. Hayasaka, H. Okano, Y. Horiike, Solid State Technology, Apr. 1988, pp. 127–130.

"Photochemistry of Interhalogen Compounds of Interest as Rocket Propellants", Arthur E. Axworthy, R.D. Wilson, K.H. Mueller, prepared for Air Force Office of Scientific Research, Sep. 1973.

"Plasmaless Dry Etching of Silicon Nitride Films with Chlorine Trifluoride Gas", Yoji Saito, Masahiro Hirabaru, Akira Yoshida, IEICE Trans. Electron, vol. E75–C, No. 7, Jul. 1992, pp. 834–838.

HIGHLY SELECTIVE SILICON OXIDE ETCHING METHOD

BACKGROUND OF THE INVENTION

In semiconductor device processing, oxides of silicon are used in many different forms for many applications. Dense, thermally grown oxides of silicon are typically used as the primary gate dielectric film in MOS (metal oxide-silicon) transistors. Steam grown thermal oxides are commonly used as a field oxidation dielectric layer. Undoped chemically deposited oxides, such as tetraethylorthosilicate derived oxide (TEOS), produced by wet or vapor (CVD) processes are other types of dense oxides commonly encountered.

Other forms of silicon oxide commonly encountered are porous. Examples include doped oxides such as phosphosilicate glass (PSG) and borophosphosilicate glass (BPSG), which are commonly used as inter-metal layer dielectrics because they can be easily planarized with an elevated temperature reflow process. Spin-on-glass (SOG) is another porous oxide used in dielectric applications where planarization is critical. An SOG is a siloxane-type polymer in an organic solvent which is deposited in liquid form and then cured at elevated temperature to form a solid silicon oxide film. Other porous silicon oxides commonly encountered include borosilicate glass (BSG), boron doped TEOS, phosphorous doped TEOS and boron/phosphorous doped TEOS (BP TEOS).

Many semiconductor device manufacturing processes require selective etching processes to allow for removal of one form of silicon oxide in preference to another form of silicon oxide or to another material.

In the case of selective etching of oxides, liquid hydrogen fluoride (HF) is typically not successful due to very similar wetting and etching characteristics of most oxides. It may be possible to enhance selectivity in some wet HF systems using buffered HF.

It is known, from U.S. Pat. No. 4,749,440, to use moist HF vapor to effect silicon oxide removal. Using a commercial embodiment of this technology sold under the Excalibur® brand by FSI International, Chaska, Minn., U.S.A., selectivities between specific oxides such as boron phosphorous silica glass (BPSG) and thermal oxide have been demonstrated up to 5:1.

Recently, it has been proposed to build a cylindrical capacitor device from a silicon substrate having a hollow cylinder of polysilicon with a depth of approximately 5,000 Å thereon. This cylinder is built up on a dense silicon oxide layer, typically TEOS. In the manufacturing process, a cylinder filled with a porous oxide, typically BP TEOS, is produced on the undopeal TEOS oxide layer, leaving the TEOS oxide layer exposed around the outside of the cylinder base. The BP TEOS contents of the cylinder must then be removed without destroying the polysilicon walls and without over etching the exposed TEOS layer under the cylinder. To accomplish this selective removal task using a masking, etching and cleaning technique could require as many as 15 individual process steps.

There therefore exists a need for a gentle method of removing of a porous silicon oxide such as BP TEOS with extremely high selectivity relative to undoped silicon oxides such as TEOS. In particular, selectivities on the order of 50:1 to 100:1 are required.

SUMMARY OF THE INVENTION

The present invention satisfies the need for a single process which permits extremely highly selective removal of porous silicon oxides, especially doped oxides, relative to dense silicon oxides in a gentle manner. In particular, the process of the invention allows the etching out of a 5,000 Å deep polysilicon walled cylinder filled with BP TEOS with less than 100 Å etch of the exposed blanket layer of TEOS outside and below the cylinder.

The invention is in one aspect a process for selectively removing a porous silicon oxide layer from a substrate having a portion thereon with an exposed dense silicon oxide to be retained on the substrate, the porous silicon oxide layer containing absorbed moisture therein, the process comprising:

introducing the substrate to a flowing anhydrous gaseous environment consisting of anhydrous inert gas;

adding anhydrous hydrogen fluoride gas to the gaseous environment for a pulse time which is at most only shortly longer than that required to initiate etching of the dense silicon oxide;

flushing the gaseous environment with anhydrous inert gas for a time sufficient to remove said hydrogen fluoride and water vapor generated by the etching of the porous oxide; and, repeating said adding and flushing steps until said porous oxide layer has been removed.

Hollow polysilicon cylinders, as described above, or other hollow container shapes of polysilicon or amorphous silicon, produced by the inventive method comprise a further aspect of the invention.

DETAILED DESCRIPTION OF THE INVENTION

Figure 1:
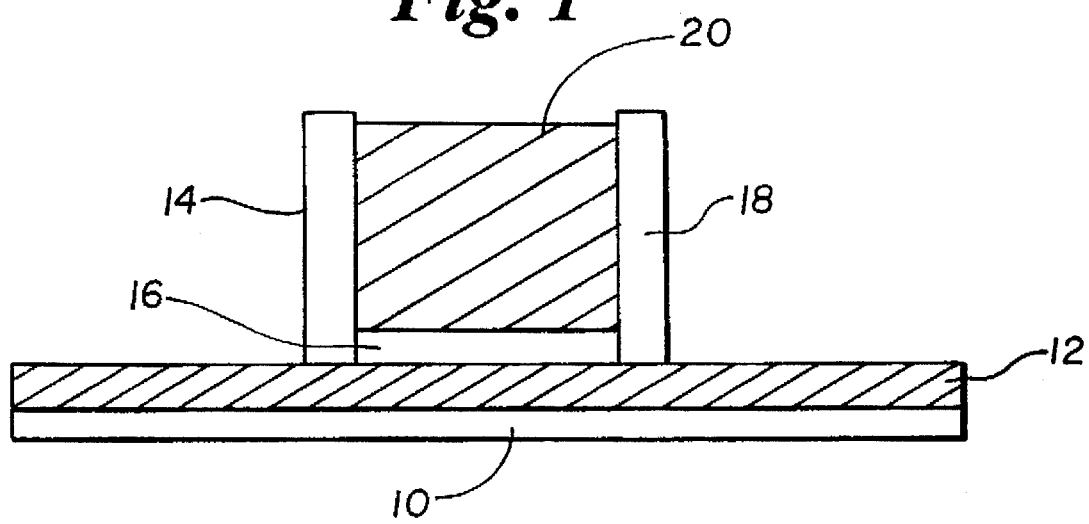
FIG. 1 is a schematic sectional view of a silicon substrate covered with an dense undopeal TEOS silicon oxide layer upon which has been built a polysilicon cylinder filled with a porous BP TEOS silicon oxide to be removed without destruction of the TEOS layer.
Figure 2:
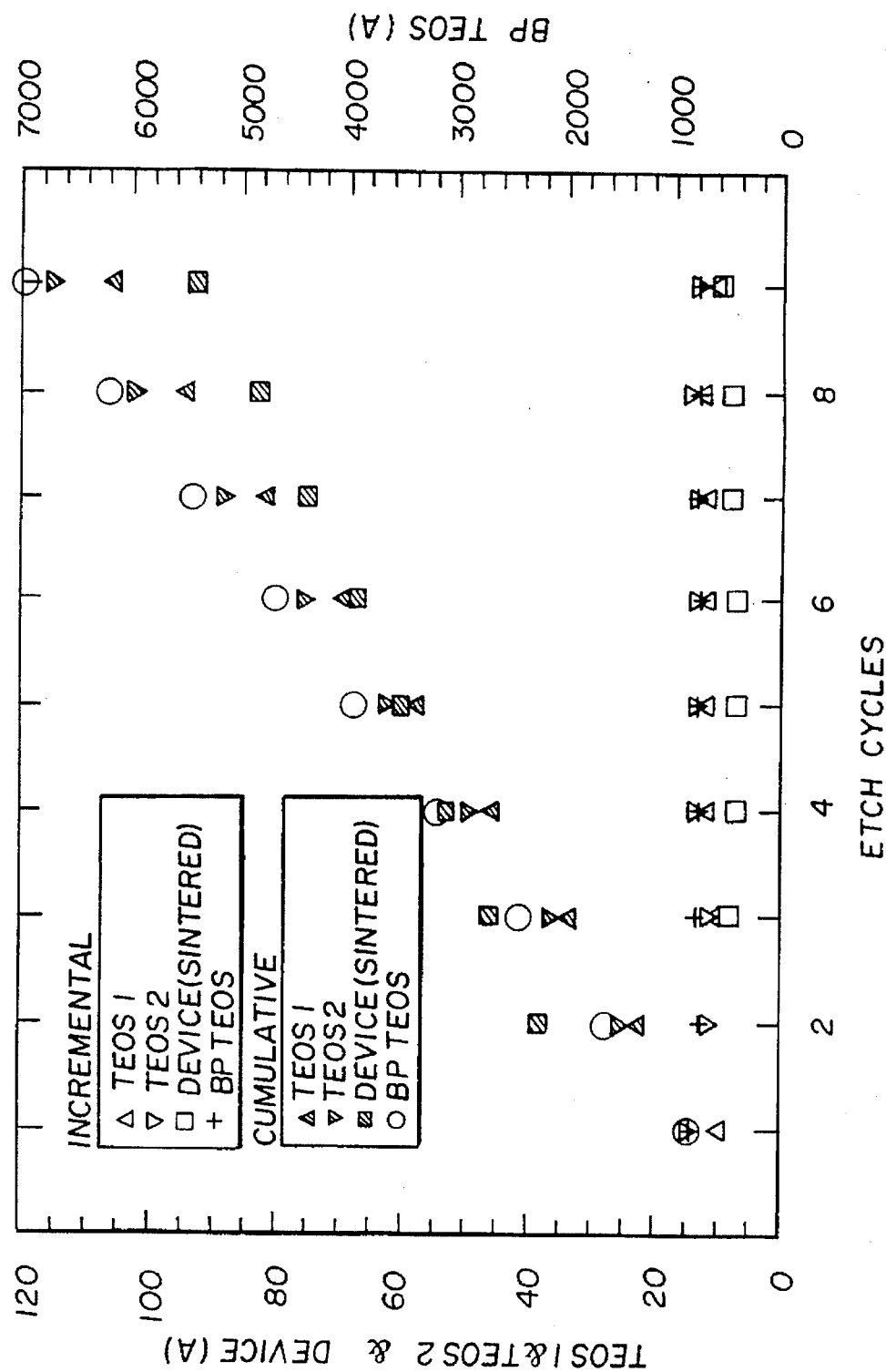
FIGS. 2–5 plot the incremental and cumulative removed oxide measurements for each wafer employed in Examples 1–4, respectively. In these Figures, the TEOS layer measurements on the TEOS 1, TEOS 2 on Device Wafers are reflected by the left hand scale while the BP TEOS layer measurements on the BP TEOS blanket film wafer is reflected on the right hand scale.
Figure 3:
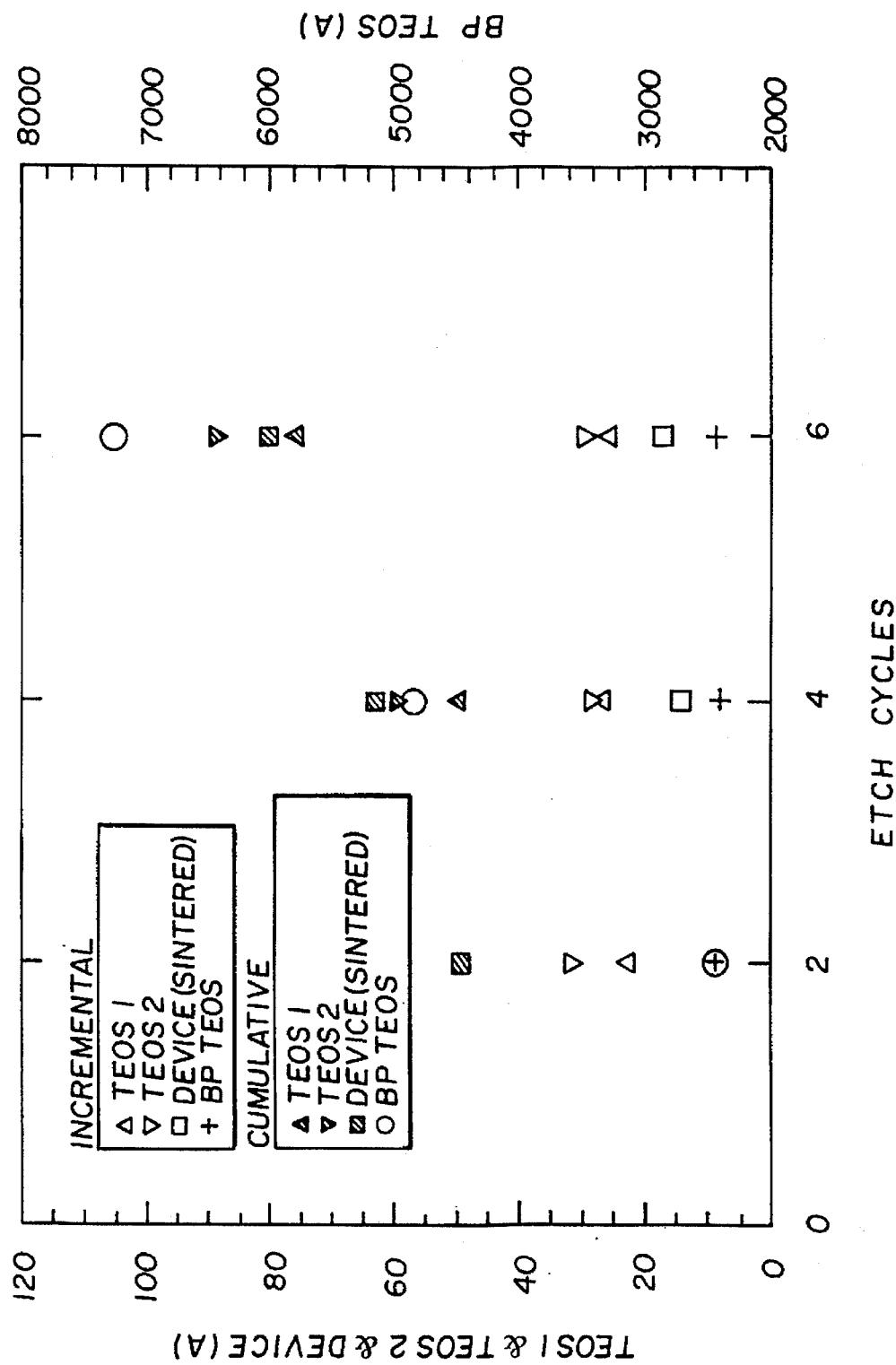
Figure 4:
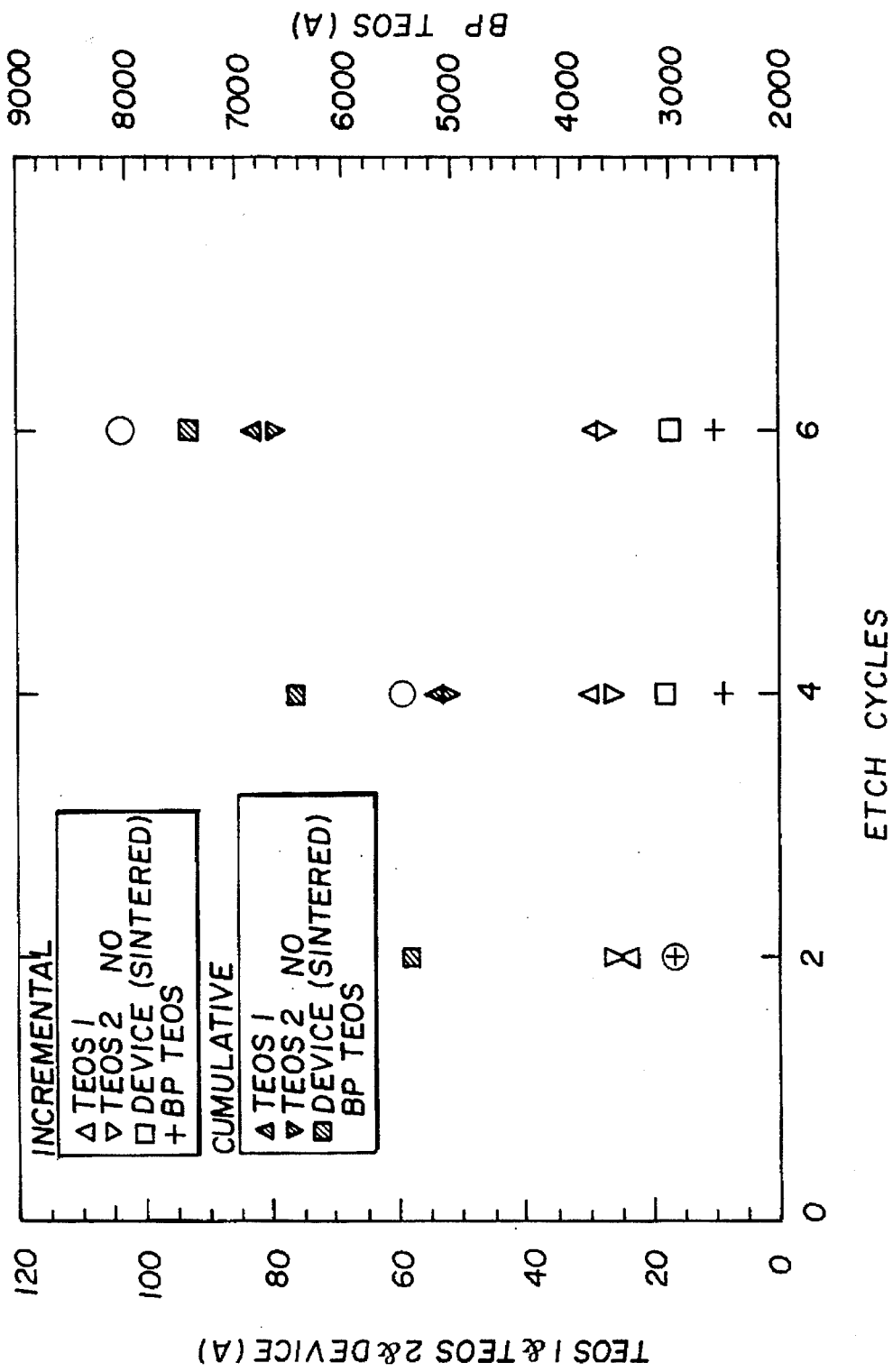
Figure 5:
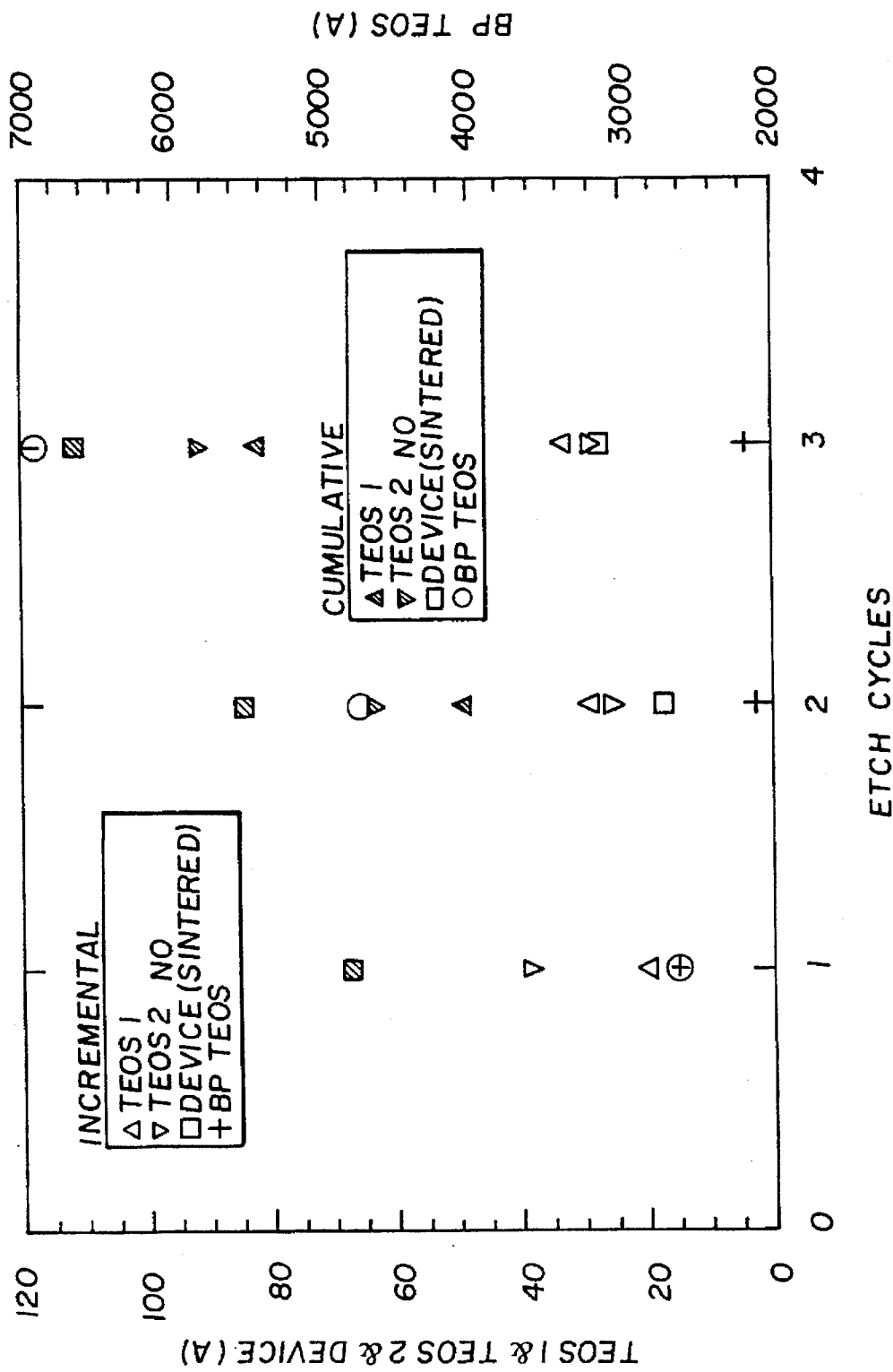

U.S. Pat. No. 4,749,440 describes the vapor phase etching of silicon dioxide as follows:

$$4HF + SiO_2 \xrightarrow{\text{water vapor}} SiF_4(vapor) + 2H_2O(vapor)$$

The reference notes that water vapor acts as a catalyst and the above formula shows that for every molecule of silicon dioxide etched, two molecules of water vapor are produced. Therefore, the reaction is auto-accelerating. Once initiated, the reaction will continue regardless of the presence or absence of water in the oxide layer until the supply of HF to the substrate is stopped.

In the processes of building up structures containing both porous silicon oxides, such as doped oxides, and dense silicon oxides, such as undoped thermal or CVD oxide, the structure is inevitably exposed to water or aqueous reagents or water vapor. Because of the porosity of the doped silicon oxide, this results in the silicon oxide layers containing absorbed moisture within the porous structure. Relatively less dense silicon oxides contain less or no absorbed moisture and any surface moisture can be readily removed by exposure to dry environments at mildly elevated temperatures.

Because water vapor is a necessary catalyst to initiate the etching of silicon oxide, initiation of etching of porous silicon oxide layers occurs faster than initiation and subsequent etching of dense silicon oxide, even when the two types of oxides are directly adjacent. However, in reactors, such as the type described in U.S. Pat. No. 4,749,440, water vapor produced by file etching of a porous oxide cannot be confined to the immediate vicinity of the doped oxide and thus finds its way into the general gaseous environment where it can function to catalyze removal of the dense oxide as well. Once initiated, the dense oxide produces water vapor immediately adjacent the oxide layer, auto-accelerating its etching as well. While the porous oxide will often continue to etch faster (selectivities of 3:1–5:1 are typical, with selectivity of 10:1 occurring in some circumstances), the rate differences are not adequate for the type of application to which the present invention is directed.

The present invention involves the recognition that selectivity for porous oxide can be enhanced by subjecting the substrate to an anhydrous gas mixture containing hydrogen fluoride in multiple pulsed cycles with intervening hydrogen fluoride-free flush cycles to remove water vapor generated by the etching of the porous oxide. Water vapor present in the porous oxide will initiate autoaccelerated etching of the porous oxide upon addition of anhydrous hydrogen fluoride, before etching of the dense oxide is initiated. If the hydrogen fluoride exposure is kept short enough, the moisture vapor generated by the porous oxide etching will not be sufficient to provide a substantial initiation of etching of the dense oxide, because of the lag time in transferring the generated moisture vapor from the vicinity of the porous oxide to the gaseous environment generally. Stopping the hydrogen fluoride feed into the reaction chamber before, or very shortly after, initiation of the dense oxide removal occurs, stops the reaction. The environment is then flushed with dry inert gas only so as to remove all water vapor generated during the short etch cycle. Reintroduction of hydrogen fluoride after the environment has been flushed, provides the process with a second initiation time lag which can be exploited in the same manner. As long as the hydrogen fluoride pulses are sufficiently short, and the subsequent flush is conducted so as to efficiently restore the gaseous environment to anhydrous condition, the dense oxide etch rate will be extremely low. Desirably the pulse times are selected so as to provide a total process selectively or porous oxide relative to dense oxide of about 25:1 or higher, preferably at least 50:1, and still more preferably higher than 75:1.

The actual pulse times may vary widely depending on the flow rate of the gas provided to the reaction chamber, the concentration of hydrogen fluoride, the water concentration in the porous oxide, and the relative amounts of surface exposure of porous oxide versus dense oxide, and the temperature at which the reaction is conducted.

Flush cycles used in the process of the invention will generally be much longer than the pulse cycles. Therefore, it is advantageous to run the hydrogen fluoride pulse as long as possible before substantial etching of the dense oxide layer is initiated in order to minimize the total number of cycles required to etch the porous oxide to the desired depth. Suitable anhydrous inert gases for flushing the environment include nitrogen ($N_2$), helium (He) and argon (Ar).

The etching reactions are generally accelerated with temperature when moisture is present. Elevated temperature, however, also functions to dry moisture from the immediate substrate surface. This does not substantially affect the initiation and etch of porous oxide because moisture necessary to initiate an accelerate etch is retained in the oxide structure. However, on dense oxide surfaces the drying effect of elevated temperature functions to further delay initiation of etching. Consequently the selectivity ratio between the two oxide types can be enhanced by elevated temperature. Temperatures in the range of ambient to 100° C. or even higher are generally suitable. Temperatures as high as 200° C. may be suitable in some circumstances. Temperatures of at least 35° C. are recommended. In specific applications investigated, gas temperatures of 35°–45° C. work very well.

Gas flow rate also effects the initiation and etching rates of the respective oxides. Very high flow rates rapidly remove water so that the flush cycle can be shortened. Also, the hydrogen fluoride pulse can be extended before initiation of the dense oxide occurs when high flow rates are employed. Flow rates on the order of 45–60 liters per minute, i.e., double to triple the flow rates employed in moist HF vapor etch processes have been found to be most desirable.

The hydrogen fluoride is desirably added to the flowing inert gas to produce a gas mixture during the etching pulse. Under application conditions tested hydrogen fluoride concentration is suitably maintained at about 1.5–2.0%, more preferably 1.7–1.9%. Concentrations outside these ranges, however, may be suitable or even optimal in other applications or under other conditions of pressure, temperature and flow rate.

Flushing of the chamber is suitably accomplished with high rate flow of anhydrous inert gas at elevated temperature. Other flushing techniques, however, may also be suitable, such as vacuum pumping. The flushing step may also be accompanied by heating or irradiation to enhance moisture desorption during the flush cycle.

To remove 5,000 Å BP TEOS while removing less than 100, typically about 80 Å or less of TEOS, it has been found that by using the recommended conditions above, 2–9 pulses between about 3 and 8 seconds each preceded and interspersed by flush cycles of up to 60 seconds each can be employed. It should be noted, however, that these conditions are generally preferred, and any specific application parameters may fall outside these recommended ranges and still provide suitable, or even optimal, conditions for achieving the desired selectivity for that application.

The substrate materials which can be treated by the present process can generally be any type of substrate material, but commonly will constitute silicon, silicon dioxide (including quartz) or gallium arsenide wafer substrates.

The gas mixture may be introduced into the processing chamber in a manner which creates a uniform radial laminar flow pattern over the substrate, for instance through a gas distribution showerhead. In this manner removal of etching products is facilitated through entrainment in the laminar flow stream. However, the present invention may be accomplished using other reactive gas flow patterns In practice of the inventive method, a processing chamber as described in U.S. Pat. No. 4,749,440, modified to avoid injection of water and water vapor may be suitably employed.

A device in which the present invention has particular advantage is shown in FIG. 1 where there is shown a schematic cross-sectional view of a silicon wafer 10 which is provided with a dense blanket layer of TEOS silicon oxide 12. On layer 12, a polysilicon cylinder 14, comprising bottom member 16 and side wall 18 has been built up. The manufacturing process has left cylinder 14 filled with porous BP TEOS silicon oxide layer 20. TEOS layer 12 is in the range of 3000 Å The thickness of the BP TEOS layer 20 is generally in the range of 4,000 Å–7,000 Å, typically 4,500–5,000 Å. The process for removing layer 20 must achieve a removal of about 5,000 Å BP TEOS while removing less than 100 Å of adjacent TEOS so as to avoid undue undercutting of the cylinder.

While the process has been described in detail with regard to specific types of porous and dense oxides, it should be appreciated that some benefit can be obtained by the practice of the process in any situation where one silicon oxide species is desired to be removed at a selectively higher rate than a second, relatively more dense silicon oxide.

The invention is illustrated by the following nonlimiting examples:

EXAMPLES

Silicon wafers containing, a blanket film of TEOS (2 wafers designated respectively as TEOS 1 and TEOS 2) a blanket film of BP TEOS, and a Device as in FIG. 1 were prepared. The thickness of the silicon oxide blanket films could be measured on the TEOS 1, TEOS 2, and BP TEOS samples as could be the TEOS layer 12 on the Device wafer. The BP-TEOS layer 20 on the Device wafer was not able to be measured with available instrumentation but its removal rate is believed to be reflected by the removal rate of the BP TEOS blanket film. The silicon wafers were introduced into a process chamber as described in U.S. Pat. No. 4,749,440. The chamber was briefly evacuated to pre-purge the environment above the wafers and then anhydrous $N_2$ gas was flowed over the substrate wafers for a 60 second flush time. HF gas was then added to the gas flow, while maintaining $N_2$ flow, for a predetermined pulse time. HF flow was then cut off. Pressure was maintained at ambient throughout. Gas temperature was 40° C. In Examples 1 and 4, the wafers were removed after each HF pulse and the thickness of the oxide films measured. In Examples 2 and 3, after one pulse the wafers were left in the process chamber, and given a second flush and HF pulse before they were removed for measurement. In all cases the etch cycles were continued until the measured cumulative amount of the blanket BP TEOS film removed exceeded 5000 Å.

The parameters employed for the various examples are shown in Table 1.

TABLE 1

| Example No. | $N_2$ flow rate (l/min) | HF flow rate (cc/min) | HF % | Pulse time (seconds) |
|---|---|---|---|---|
| 1 | 60 | 1080 | 1.77 | 3 |
| 2 | 60 | 1080 | 1.77 | 5 |
| 3 | 45 | 810 | 1.77 | 5 |
| 4 | 45 | 810 | 1.77 | 8 |

Plots of incremental and cumulative removed oxide measurements for each wafer employed in Examples 1–4 showed that in all cases the TEOS removal rate for the Device layer exceeded the removal rate of the simple blanket film layers, apparently reflecting the influence of the adjacent BP TEOS on the Device wafers in shortening the initiation time for TEOS removal. However, in all cases the removal rate of BP TEOS from the BP TEOS blanket film wafer exceeded 50:1 relative to the rate of removal of the TEOS layer on the Device wafers.

What is claimed is:

1. Process for selectively etching a first silicon oxide material from a substrate having on a portion of the surface thereof said first silicon oxide and on another portion thereof a second oxide, the second silicon oxide being relatively more dense than the first silicon oxide, the process comprising:

introducing the substrate to a flowing anhydrous gaseous environment consisting of anhydrous inert gas:

adding anhydrous hydrogen fluoride gas to the gaseous environment without adding water vapor, for a pulse time which is less than twice that required to initiate etching of the dense silicon oxide;

flushing the gaseous environment with anhydrous inert gas for a time sufficient to remove said hydrogen fluoride and water vapor generated by the etching of the porous oxide; and repeating said adding and flushing steps until said first oxide has been removed from the substrate.

2. A process as in claim 1 wherein said anhydrous inert gas is selected from the group consisting of nitrogen, helium, argon and mixtures thereof.

3. A process as in claim 1 wherein said hydrogen fluoride gas is introduced into said gaseous environment in mixture with an anhydrous inert gas.

4. A process as in claim 1 wherein the gaseous environment is maintained at a temperature between ambient and 200° C.

5. A process as in claim 4 wherein the gaseous environment is maintained at a temperature between ambient and 100° C.

6. A process as in claim 5 wherein said temperature is between 35° C. and 45° C.

7. A process as in claim 1 wherein said gaseous environment is has a flow rate in excess of 30 l/min.

8. A process as in claim 7 wherein said flow rate is 45–60 l/min.

9. A process as in claim 7 wherein the hydrogen fluoride concentration in said mixture is between 1.5% and 2.0% by volume.

10. A process as in claim 9 wherein said hydrogen fluoride concentration is between 1.7% and 1.9% by volume.

11. A process as in claim 1 wherein said pulse time is selected to provide a overall process selectively for etching the porous oxide relative to the dense oxide of at least 25:1.

12. A process as in claim 1 wherein said selectively is at least 50:1.

13. A process as in claim 1 wherein said selectively is at least 75:1.

14. A process as in claim 1 wherein said pulse time is between 3 and 10 seconds.

15. A process as in claim 1 wherein said gaseous environment is maintained at about ambient atmospheric pressure.

16. A process as in claim 1 wherein said gaseous environment is has a flow rate in excess of 30 l/min.

17. A process as in claim 1 wherein said flushing step is accomplished within a period of about 1 minute or less.

18. A process as in claim 1 wherein the porous silicon oxide is selected from the group consisting of boron and phosphorus doped silica glass, phosphorous doped silica glass, boron doped silica glass, boron/phosphorous doped tetraethylorthosilicate derived oxide, and spin on glass.

19. A process as in claim 18 wherein said porous silicon oxide is boron/phosphorous doped tetraethylorthosilicate derived oxide, and said dense silicon oxide is tetraethylorthosilicate derived oxide.

20. A process as in claim 17 wherein said boron/phosphorous doped tetraethylorthosilicate derived oxide is contained within an open polysilicon or amorphous silicon container structure built on a portion of a blanket layer of tetraethylorthosilicate derived oxide silicon oxide which overlies said substrate, the depth of the polysilicon container being greater than 4000 Å.

21. A process as in claim 1 wherein the dense silicon oxide is selected from the group consisting of undopeal thermally grown silicon oxide, and undopeal chemically deposited silicon oxide.

22. A silicon wafer having a tetraethylorthosilicate derived oxide silicon oxide layer over at least a portion thereof, the wafer having an open empty container of polysilicon or amorphous silicon built up on a portion of the tetraethylorthosilicate derived oxide layer, the empty container having a depth of at least 4000 Å and having been prepared by a method as in claim 18.

* * * * *

UNITED STATES PATENT AND TRADEMARK OFFICE
CERTIFICATE OF CORRECTION

PATENT NO. : 5,635,102

DATED : June 3, 1997

INVENTOR(S) : JITESH MEHTA

It is certified that error appears in the above-identified patent and that said Letters Patent is hereby corrected as shown below:

Col. 1, line 51, delete "undopeal" and insert -- undoped --;

Col. 2, line 3, delete "A" and insert -- Å --;

Col. 2, line 33, delete "undopeal" and insert -- undoped --;

Col. 6, line 36, delete "is":

Col. 6, line 48, delete "1" and insert -- 11 --;

Col. 6, line 50, delete "1" and insert -- 12 --;

Col. 6, line 59, delete "is";

Col. 8, line 2, delete "undopeal" and insert -- undoped --;

Col. 8, line 3, delete "undopeal" and insert -- undoped --.

Signed and Sealed this

Eighteenth Day of November 1997

*Attest:*

BRUCE LEHMAN

*Attesting Officer*      *Commissioner of Patents and Trademarks*